(12) United States Patent
Baur et al.

(10) Patent No.: US 10,629,780 B2
(45) Date of Patent: Apr. 21, 2020

(54) LIGHT EMITTING DIODE CHIP WITH A REFLECTIVE LAYER SEQUENCE

(71) Applicant: OSRAM OLED GmbH, Regensburg (DE)

(72) Inventors: Johannes Baur, Regensburg (DE); Wolfgang Schmid, Gundelshausen (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/778,416

(22) PCT Filed: Nov. 16, 2016

(86) PCT No.: PCT/EP2016/077859
§ 371 (c)(1),
(2) Date: May 23, 2018

(87) PCT Pub. No.: WO2017/089198
PCT Pub. Date: Jun. 1, 2017

(65) Prior Publication Data
US 2018/0351046 A1 Dec. 6, 2018

(30) Foreign Application Priority Data
Nov. 24, 2015 (DE) .................. 10 2015 120 323

(51) Int. Cl.
*H01L 33/38* (2010.01)
*H01L 33/44* (2010.01)
(Continued)

(52) U.S. Cl.
CPC .............. *H01L 33/44* (2013.01); *H01L 33/22* (2013.01); *H01L 33/30* (2013.01); *H01L 33/405* (2013.01);
(Continued)

(58) Field of Classification Search
CPC combination set(s) only.
See application file for complete search history.

(56) References Cited

U.S. PATENT DOCUMENTS

2009/0283783 A1  11/2009  Streubel
2011/0084306 A1   4/2011  Jeong
(Continued)

FOREIGN PATENT DOCUMENTS

DE  10 2005 061 346 A1   4/2007
DE  10 2008 035 900 A1  11/2009
(Continued)

*Primary Examiner* — Steven H Loke
*Assistant Examiner* — Samuel Park
(74) *Attorney, Agent, or Firm* — DLA Piper LLP (US)

(57) ABSTRACT

An LED chip includes a carrier, a semiconductor layer sequence, a reflective layer sequence arranged in regions between the carrier and the semiconductor layer sequence, wherein the reflective layer sequence includes a dielectric layer facing the semiconductor layer sequence and a metallic mirror layer facing away from the semiconductor layer sequence, and an encapsulating layer arranged in places between the carrier and the reflective layer sequence, the encapsulating layer extending in places through the reflective layer sequence into the semiconductor layer sequence and thus forming a separating web separating an inner region of the reflective layer sequence from an edge region of the reflective layer sequence.

16 Claims, 4 Drawing Sheets

(51) Int. Cl.
*H01L 33/46* (2010.01)
*H01L 33/40* (2010.01)
*H01L 33/22* (2010.01)
*H01L 33/30* (2010.01)
*H01L 33/14* (2010.01)
*H01L 33/20* (2010.01)

(52) U.S. Cl.
CPC .............. *H01L 33/46* (2013.01); *H01L 33/14* (2013.01); *H01L 33/20* (2013.01)

(56) References Cited

U.S. PATENT DOCUMENTS

| | | |
|---|---|---|
| 2011/0114988 A1 | 5/2011 | Sabathil et al. |
| 2011/0266568 A1 | 11/2011 | Aldaz et al. |
| 2013/0187183 A1* | 7/2013 | Hoppel .................. H01L 33/382 257/98 |
| 2015/0144984 A1* | 5/2015 | Chen ...................... H01L 33/08 257/99 |
| 2016/0005930 A1 | 1/2016 | Engl et al. |

FOREIGN PATENT DOCUMENTS

| | | | |
|---|---|---|---|
| DE | 10 2010 033 137 A1 | 2/2012 | |
| DE | 10 2010 035 966 A1 | 3/2012 | |
| DE | 102012108879 A1 * | 3/2014 | ............. H01L 33/08 |
| DE | 10 2013 103 079 A1 | 10/2014 | |
| EP | 2 743 997 A2 | 6/2014 | |
| TW | 201208122 A | 2/2012 | |
| TW | 201521245 A | 6/2015 | |
| WO | 2011/135471 A2 | 11/2011 | |

* cited by examiner

LIGHT EMITTING DIODE CHIP WITH A REFLECTIVE LAYER SEQUENCE

TECHNICAL FIELD

This disclosure relates to a light-emitting diode chip with a reflective layer sequence arranged between a semiconductor layer sequence and a carrier of the light-emitting diode chip.

BACKGROUND

So-called thin-film light-emitting diode chips are known in which the original growth substrate of the semiconductor layer sequence is detached and, instead, the semiconductor layer sequence is connected to a carrier on a side opposite the original growth substrate. In this case, the radiation exit surface of the light emitting diode chip is located on a surface of the semiconductor layer sequence opposite the carrier, i.e. on the side of the original growth substrate. In such a thin-film light-emitting diode chip, it is advantageous if at least one reflective layer is arranged between the carrier and the semiconductor layer sequence to deflect radiation emitted in the direction of the carrier in the direction of the radiation exit surface and thereby increase the radiation yield.

For example, DE 10 2005 061 346 A1 describes a thin-film LED in which the mirror layer is formed by a reflective layer sequence comprising a dielectric layer and a metal layer.

We found that a reflective layer sequence can be susceptible to corrosion, especially under the influence of moisture. Especially at the interfaces in the reflective layer sequence, there may be a risk of cracks forming and penetration of moisture may be promoted.

It could therefore be helpful to provide a light-emitting diode chip with a reflective layer sequence between the carrier and the semiconductor layer sequence in which the reflective layer sequence is particularly well protected against corrosion and penetration of moisture.

SUMMARY

We provide an LED chip including a carrier, a semiconductor layer sequence, a reflective layer sequence arranged in regions between the carrier and the semiconductor layer sequence, wherein the reflective layer sequence includes a dielectric layer facing the semiconductor layer sequence and a metallic mirror layer facing away from the semiconductor layer sequence, and an encapsulating layer arranged in places between the carrier and the reflective layer sequence, the encapsulating layer extending in places through the reflective layer sequence into the semiconductor layer sequence and thus forming a separating web separating an inner region of the reflective layer sequence from an edge region of the reflective layer sequence.

REFERENCE CHARACTER LIST

Figure 1:
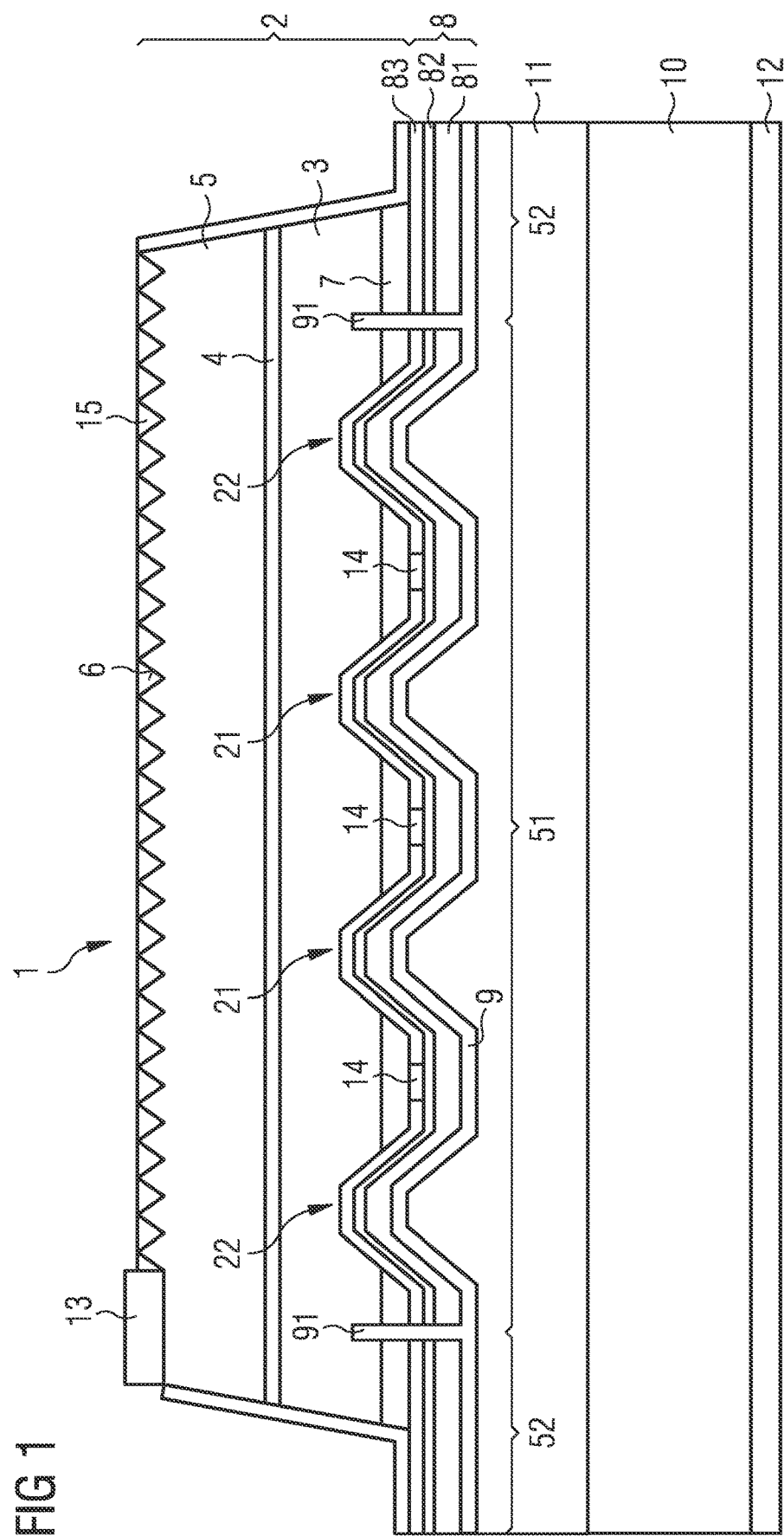
FIG. 1 shows a schematic representation of a cross section through a light emitting diode chip according to a first example.

1 LED chip
2 semiconductor layer sequence
3 p-type semiconductor region
4 active layer
5 n-type semiconductor region
6 radiation exit surface
7 current spreading layer
8 reflective layer sequence
9 encapsulation layer
10 carrier
11 connecting layer
12 first contact layer
13 second contact layer
14 p-contact vias
15 protective layer
21 recess
22 edge recess
51 inner region
52 edge region
81 metallic reflective layer
82 adhesive layer
82 dielectric layer
91 separating web

DETAILED DESCRIPTION

Our light emitting diode chip may contain a carrier and a semiconductor layer sequence, preferably based on a III-V compound semiconductor material such as a phosphide compound semiconductor, an arsenide compound semiconductor, an arsenide phosphide compound semiconductor or a nitride compound semiconductor.

The semiconductor layer sequence is particularly preferably based on a phosphide compound semiconductor material. "Based on a phosphide compound semiconductor material" means that the semiconductor layer sequence or at least one layer thereof comprises a III-phosphide compound semiconductor material, preferably $In_xAl_yGa_{1-x-y}P$, where $0 \leq x \leq 1$, $0 \leq y \leq 1$ and $x+y \leq 1$, without necessarily having a mathematically exact composition according to the above formula. Rather, it may contain one or more dopants and additional components that do not substantially alter the characteristic physical properties of the $In_xAl_yGa_{1-x-y}P$ material. For simplicity, however, the above formula contains only the essential components of the crystal lattice (In, Al, Ga, P), even if they can be partially replaced by small amounts of other substances.

The semiconductor layer sequence contains in particular a p-type semiconductor region, an n-type semiconductor region and an active layer that emits electromagnetic radiation arranged between the p-type semiconductor region and the n-type semiconductor region. The active layer may be configured in particular to emit visible light or near infrared radiation.

The active layer can be a pn junction, a double heterostructure, a single quantum well structure or a multiple quantum well structure. The term quantum well structure encompasses any structure in which charge carriers undergo a quantization of their energy states by confinement. In particular, the term quantum well structure does not contain any information about the dimensionality of the quantization. It thus includes, among other things, quantum wells, quantum wires or quantum dots and any combination of these structures.

The n-type semiconductor region of the light emitting diode chip preferably faces a radiation exit surface of the light emitting diode chip, and the p-type semiconductor region faces the carrier of the light emitting diode chip. Preferably, the light-emitting diode chip is a so-called thin-film light-emitting diode chip in which a growth substrate used to grow the semiconductor layer sequence is removed from the light-emitting diode chip. The original growth substrate can particularly be removed from the n-type semiconductor region of the semiconductor layer sequence. On the side of the p-type semiconductor region opposite the original growth substrate, the LED chip preferably connects to the carrier, for example, by a soldered connection. In this case, the carrier is different from a growth substrate of the semiconductor layer sequence and preferably contains silicon, molybdenum or germanium. In the light-emitting diode chip, the p-type semiconductor region faces the carrier and the n-type semiconductor region faces the radiation exit surface.

Between the carrier and the semiconductor layer sequence, a reflective layer sequence is advantageously arranged, which has a dielectric layer facing the semiconductor layer sequence and a metallic mirror layer facing away from the semiconductor layer sequence. The purpose of the reflective layer sequence is in particular to reflect back the radiation emitted from the active layer in the direction of the carrier to a radiation exit surface of the light-emitting diode chip opposite the carrier.

The dielectric layer of the reflective layer sequence preferably has a refractive index lower than the refractive index of the adjacent semiconductor material. In particular, the dielectric layer causes a total reflection of radiation that hits the interface between the semiconductor layer sequence and the dielectric layer at an angle of incidence greater than the critical angle of total reflection. For example, the dielectric layer may contain a silicon oxide or a silicon nitride.

Radiation not reflected by total reflection at the dielectric layer is preferably reflected at the metallic mirror layer in the reflecting layer sequence. The metallic mirror layer may comprise or consist of gold in particular. Alternatively, the metallic mirror layer can also comprise or consist of another reflective metal such as silver or aluminum.

An encapsulating layer to protect the reflective layer sequence against corrosion may be arranged at least partially between the carrier and the reflective layer sequence. The encapsulation layer extends advantageously through the reflective layer sequence into the semiconductor layer sequence. In particular, the encapsulation layer may end in the p-type semiconductor region of the semiconductor layer sequence, whereby the active layer is not cut through by the encapsulation layer.

The reflective layer sequence is cut through by the encapsulating layer, in particular in a direction perpendicular to the carrier. In this way, the encapsulation layer forms a separating web that separates an inner region of the reflective layer sequence from an edge region of the reflective layer sequence. The feature that the separating web separates an inner region of the reflective layer sequence from an edge region of the reflective layer sequence and completely encloses the inner region distinguishes the separating web in particular from any contact feedthroughs which penetrate the reflective layer sequence only selectively to contact the LED chip from the side of the carrier. Such contact feedthroughs through the reflective layer sequence and/or regions of the semiconductor layer sequence do not form a separating web that separates an inner region from an edge region.

Because an edge region of the reflective layer sequence is separated from an inner region of the reflective layer sequence by the separating web, the inner region is particularly well protected against corrosion and penetration of moisture. In particular, it prevents cracks or crevices that could occur in the reflective layer sequence, especially at interfaces of the reflective layer sequence from continuing into the interior of the reflective layer sequence. Such cracks or crevices could promote penetration of moisture. Furthermore, the separating web forms a barrier that reduces propagation of moisture in the layer material of one of the layers of the reflective layer sequence. In particular, propagation of moisture in the dielectric layer such as an $SiO_2$ layer is reduced by the separating web.

The separating web preferably completely encloses the inner region so that the inner region does not adjoin the edge region at any point in particular. In other words, the separating web is a circumferential separating web that completely separates the interior of the reflective layer sequence from an edge region. The separating web runs in particular at a distance along all side flanks of the LED chip. In plan view, the separating web forms a closed polygon course, which runs at a distance along the side flanks of the LED chip. For example, in a rectangular or square LED chip, the separating web can be viewed from above in the form of a rectangle or a square at a distance along the side flanks of the LED chip.

Between the dielectric layer and the metallic mirror layer, an adhesive layer is preferably arranged in the reflective layer sequence, which is preferably electrically conductive. For example, the adhesive layer may have a transparent conductive oxide (TCO), especially indium tin oxide (ITO). The adhesive layer improves the adhesion between the metallic mirror layer and the dielectric layer.

In an adhesive layer between the metallic mirror layer and the dielectric layer which, for example, has ITO, the separating web cutting through the reflective layer sequence prevents cracking at the interfaces to the dielectric layer and the metallic mirror layer and reduces corrosion of the adhesive layer. Furthermore, the separating web prevents the adhesion promoting effect of the adhesive layer in the inner region from being reduced by the influence of moisture.

Preferably, the semiconductor layer sequence has a current spreading layer on one side facing the reflective layer sequence, at least in some areas. The current spreading layer is preferably an AlGaAs based layer. The current spreading layer comprises in particular one or more $Al_xGa_{1-x}As$ layers with $0<x\leq1$. For a light emitting diode chip intended for emission in the visible spectral range, preferably $0.5<x<1$, especially preferably $0.6\leq x\leq0.8$ holds true. The current spreading layer is preferably p-doped.

Preferably, the current spreading layer as well as the reflective layer sequence is at least partially completely severed by the encapsulation layer. In particular, it is possible that the separating web also cuts the current spreading layer in a vertical direction so that an inner region of the current spreading layer is separated from an edge region of the current spreading layer. In this case, the separating web extends advantageously through the reflective layer sequence and the current spreading layer into the semiconductor layer sequence. In this way, the interior of the current spreading layer is particularly well protected against corrosion. This example takes advantage of the fact that the current spreading layer is comparatively susceptible to corrosion, especially when AlGaAs is used.

In this configuration, the separating web advantageously forms a barrier separating the interfaces between the encapsulation layer and the metallic mirror layer, between the metallic mirror layer and the optionally existing adhesive layer, between the optionally existing adhesive layer and the dielectric layer, between the dielectric layer and the current spreading layer and between the current spreading layer and the semiconductor layer sequence in a vertical direction. In this way, the separating web forms a barrier that effectively reduces propagation of moisture, cracks or crevices along the interfaces.

Preferably, the encapsulating layer is a metallic layer. In other words, the encapsulation layer contains at least one metal or metal alloy. We found that a metallic layer forms a particularly good barrier against formation or progression of cracks or crevices along interfaces. Furthermore, the encapsulation layer simultaneously forms a barrier against penetration of moisture. In a metallic layer, the encapsulation layer is advantageously an electrically conductive layer and can be part of an electrically conductive connection between the carrier and the semiconductor layer sequence.

For example, the carrier can be electrically conductive and connected to the encapsulation layer by an electrically conductive bonding layer such as a solder layer. The metallic mirror layer and an electrically conductive adhesive layer such as an ITO layer can follow the encapsulation layer in the direction of the semiconductor layer sequence, the electrically conductive adhesive layer being connected to the semiconductor layer sequence by contact vias through the dielectric layer. In this example, the encapsulation layer is part of the layers provided for electrical contacting of the light emitting diode chip. In particular, in a metallic encapsulation layer, no vias through the encapsulation layer are required, for example, to connect an electrically conductive connecting layer to the metallic mirror layer. When using a metallic encapsulation layer, the manufacturing effort is therefore comparatively low.

The encapsulation layer preferably contains at least one of the metals titanium, gold, platinum, nickel, tungsten or at least one metal alloy comprising at least one of these metals. The encapsulation layer can be a single layer or a sequence of layers consisting of several sub-layers, each of which preferably comprises at least one of the metals mentioned. For example, a layer sequence consisting of a Ti layer and a TiW layer has proven to be advantageous, with the Ti layer facing the semiconductor layer sequence. Ti forms a comparatively poor connection to the semiconductor material in the areas where the separating web extends into the semiconductor layer sequence. This is advantageous, since a current injection in the edge region of the LED chip in which the separating web runs is not desired, for example, to avoid non-radiative recombinations in the area of the side flanks of the LED chip.

The separating web projecting into the semiconductor layer sequence is not intended in particular for the electrical connection of the semiconductor material in this area. It may even be advantageous to reduce the electrical conductivity of the semiconductor material in the area of the separating web, for example, by plasma treatment to cause a poor electrical connection of the separating web to the semiconductor material. Electrical contacting of the semiconductor layer sequence on the side facing the carrier is advantageous not in the area of the separating web, but in the inner region separated from the separating web, preferably by contact vias arranged in the inner region, that are led from the metallic mirror layer and/or the electrically conductive adhesive layer through the dielectric layer to the semiconductor layer sequence.

Alternatively, the encapsulation layer is a dielectric layer, in particular an oxide layer. The dielectric layer is preferably 10 nm to 100 nm thick. The encapsulation layer is an aluminum oxide layer, especially an $Al_2O_3$ layer. In a dielectric layer, the encapsulation layer is preferably a layer deposited by atomic layer deposition (ALD). A particularly dense layer can be produced advantageously by atomic layer deposition that offers a particularly high level of protection against penetration of moisture. Compared to the use of a metal layer, however, the use of a dielectric encapsulation layer requires an increased manufacturing effort since openings may have to be created in the encapsulation layer to produce electrical contact vias. This may require an additional lithographic step during production of the light emitting diode chip.

Preferably, the semiconductor layer sequence has recesses on a side facing the carrier, the cross section of the recesses increasing in the direction of the carrier. The recesses can have a prism-shaped cross section in particular. The advantage of the preferably prism-shaped recesses is that the probability of multiple total reflections at the opposite interfaces of the semiconductor layer sequence is reduced. In this way, the coupling-out of radiation can be improved and/or the angular spectrum of the emitted radiation can be specifically influenced.

The recesses may have an edge recess facing the outside of the light emitting diode chip. The edge recess is in other words the recess closest to the outside of the LED chip. The edge recess can be designed in particular as an edge prism, whereby the edge prism is preferably a circumferential edge prism that completely surrounds an inner region of the light-emitting diode chip, for example, in the form of a ring or a closed polygon. The separating web is preferably arranged between the edge recess and the outside of the LED chip. This has the advantage that absorption of radiation at the separating web is reduced by reflecting and deflecting at least part of the radiation emitted in the direction of the separating web at the edge recess.

Alternatively, the separating web is arranged in the edge recess, for example, in the center of an edge prism. This example has the advantage that no additional space for the separating web has to be provided at the edge of the LED chip. On the other hand, compared to the arrangement of the separating web next to the edge recess, a slightly increased optical absorption at the separating web is accepted.

Further alternatively, the LED chip may have no edge recess. In this case, the separating web is preferably arranged between a p-contact via through the dielectric layer of the reflective layer sequence and the edge of the LED chip. In this example, the manufacturing effort is particularly low and there is a small space requirement in the area of the edge of the light emitting diode chip due to omission of the edge recess. On the other hand, radiation emitted in the direction of the separating web is not deflected by an edge recess and can thus be absorbed at least partially at the separating web.

Our chips are explained in more detail below using examples with reference to the drawings.

Identical or equal acting elements are provided with the same reference signs in the figures. The sizes of the individual elements as well as the proportions of the elements among themselves are not to be regarded as true to scale.

The LED chip 1 shown in FIG. 1 contains a semiconductor layer sequence 2 having a p-type semiconductor region 3 and an n-type semiconductor region 5. An active layer 4 is arranged between p-type semiconductor region 3 and n-type semiconductor region 5.

The active layer 4 is in particular a radiation-emitting layer. The active layer 4 can, for example, be designed as a pn junction, a double heterostructure, a single quantum well structure or a multiple quantum well structure. The term quantum well structure encompasses any structure in which charge carriers undergo a quantization of their energy states by confinement. In particular, the term quantum well structure does not contain any information about the dimensionality of the quantization. It thus includes, among other things, quantum wells, quantum wires and quantum dots and any combination of these structures.

The semiconductor layer sequence 2 is based on a III-V compound semiconductor. Preferably, the semiconductor layer sequence 2 is based on a phosphide compound semiconductor, i.e. the semiconductor layers contained in the semiconductor layer sequence 2 have especially $In_xGa_yAl_{1-x-y}P$ with $0 \leq x \leq 1$, $0 \leq y \leq 1$ and $x+y \leq 1$. In particular, the p-type semiconductor region 3, the active layer 4 and the n-type semiconductor region 5 contain semiconductor layers of phosphide compound semiconductor materials.

Light emitting diode chip 1 is a so-called thin-film LED in which a growth substrate used to grow the semiconductor layer sequence 2 has been detached from the semiconductor layer sequence 2. In particular, the growth substrate may be detached from the n-type semiconductor region 5 that now has the radiation exit surface 6 of the light emitting diode chip. To improve coupling-out of radiation, the radiation exit surface 6 may have a roughening or structuring. Exposed areas of semiconductor layer sequence 2 such as the radiation exit surface 6 and the side flanks of the LED chip 1 can be advantageously provided with a protective layer 15 containing, for example, a silicon nitride.

The LED chip 1 connects to a carrier 10 on one side opposite the original growth substrate and the radiation exit surface 6. Carrier 10 may contain silicon, germanium or molybdenum, for example. In the LED chip 1, the n-type semiconductor region 5 faces the radiation exit surface 6 and the p-type semiconductor region 3 faces the carrier 10. The light emitting diode chip 1 can be connected to the carrier 10 in particular by a connecting layer 11 comprising, for example, a solder layer. Connecting layer 11 can comprise several sublayers, for example, adhesive and wetting layers can be provided in addition to a solder layer.

The carrier 10, for example, can be an electrically conductive carrier. In this example, a first contact layer 12 can be arranged on a rear side of the carrier and a second contact layer 13, for example, in the form of a bonding pad can be arranged on the radiation exit surface 6 of light emitting diode chip 1.

A current spreading layer 7 is arranged between the carrier 10 and the p-type semiconductor region 3. The current spreading layer 7 is preferably a layer based on aluminum gallium arsenide, which in particular contains $Al_xGa_{1-x}As$ with $0<x\leq 1$. For an LED chip emitting in the visible spectral range, the aluminum portion x in the current spreading layer 7 is preferably $0.5<x\leq 1$, especially preferably $0.6\leq x \leq 0.8$. For an LED chip emitting in the infrared spectral range, a lower aluminum portion x in the current spreading layer, for example, $x\leq 0.5$ or $x\leq 0.25$, can be advantageous. The current spreading layer 7 preferably has a thickness of less than 500 nm, preferably less than 300 nm.

As an alternative to AlGaAs, the current spreading layer 7 may contain a phosphide compound semiconductor material such as GaP in particular.

The current spreading layer 7 is preferably p-doped and preferably has a dopant concentration of more than $1\times 10^{19}$ $cm^{-3}$ and particularly preferably more than $5\times 10^{19}$ $cm^{-3}$.

On a side 2 of the current spreading layer 7 remote from the semiconductor layer sequence, a reflective layer sequence 8 is arranged, which is intended to reflect radiation emitted in the direction of the carrier 10 in the direction of the radiation exit surface 6. The reflective layer sequence 8 preferably contains a dielectric layer 83 adjacent to the current spreading layer 7 and additionally a metallic mirror layer 81. An adhesive layer 82 is preferably arranged between the metallic mirror layer 81 and the dielectric layer 83, which adhesive layer 82 in particular can comprise a transparent conductive oxide such as ITO.

The dielectric layer 83 may, for example, comprise a silicon oxide layer and/or a silicon nitride layer and has a lower refractive index than the current spreading layer 7 adjacent to it. The reflection effect of dielectric layer 83 is essentially based on the effect of total reflection. Radiation emitted in the active layer 4, which hits the interface between the current spreading layer 7 and the dielectric layer 83 at an angle of incidence greater than the critical angle of total reflection, is totally reflected at the dielectric layer 83.

Furthermore, radiation incident on the dielectric layer 83 at angles of incidence smaller than the critical angle of total reflection is transmitted through the dielectric layer 83 and the transparent adhesive layer 82 and reflected back at the metallic mirror layer 81 in the direction of semiconductor layer sequence 2. The metallic mirror layer preferably comprises a metal with a high reflection, especially gold, aluminum or silver. The reflective layer sequence 8 thus improves the radiation yield.

A further improvement in the radiation yield of light emitting diode chip 1 is achieved by the fact that the semiconductor layer sequence 2 has a plurality of recesses 21, 22 on one side facing the carrier 10 that have a cross-sectional area increasing in the direction of the carrier 10. The recesses 21, 22 can be prism-shaped recesses in particular. The recesses 21, 22 can, for example, extend through the current spreading layer 7 into the p-type semiconductor region 3. The inclined side surfaces of the recesses 21, 22 facing the semiconductor layer sequence 2 prevent in particular multiple total reflection within the semiconductor layer sequence 2 that could occur in plane-parallel interfaces.

In the LED chip 1, an encapsulation layer 9 is advantageously arranged between the carrier 10 and the reflective layer sequence 8. The encapsulation layer 9 preferably adjoins the metallic mirror layer 81. In particular, encapsulation layer 9 may be located between the connecting layer 11 that connects the LED chip 1 to the carrier 10 and the metallic mirror layer 81.

The encapsulation layer 9 is preferably a metallic layer. The metallic encapsulation layer 9 can be a single layer or have several sublayers. In particular, metallic encapsulation layer 9 may contain one or more layers of Ti, TiW, TiW(N), Au, Pt, Ni, NiAu, or PtAu. A Ti—TiW layer sequence is particularly advantageous, for example, with the Ti layer facing the semiconductor layer sequence.

The encapsulation layer 9 advantageously comprises a separating web 91 extending through the reflective layer sequence 8 and the current spreading layer 7 into the semiconductor layer sequence 2. The separating web 91 extends in particular into the p-semiconductor region 3.

However, the active layer 4 and the n-type semiconductor region 5 are not severed by the separating web 91.

The separating web 91 separates an edge region 52 of the reflective layer sequence 8 and the current spreading layer 7 from an inner region 51 of the reflective layer sequence 8 and the current spreading layer 7. The separating web 91 is in particular a circumferential separating web completely separating the edge region 52 from the inner region 51. The edge regions 52 of the current spreading layer 7 and the reflective layer sequence 8 preferably do not adjoin the inner region 51 at any point. In particular, the interfaces between layers 81, 82, 83 of reflective layer sequence 8, current spreading layer 7 and p-type semiconductor region 3 are completely severed by the separating web 91. The separating web thus forms a barrier at the interfaces in a vertical direction that prevents progression of any crack formation at the interfaces. The inner region 51 of the reflective layer sequence 8 and the current spreading layer 7 is therefore particularly well protected against corrosion, crack formation and/or penetration of moisture.

The metallic separating web 91 projects into the semiconductor layer sequence 2, but is preferably not intended for electrical contacting of the semiconductor layer sequence 2. An electrical connection of the separating web 91 to the semiconductor material is therefore undesirable, as this would result in increased current injection into the edge region of the semiconductor layer sequence 2. However, an increased current flow in the edge region of the LED chip 1 is not expedient, as non-radiative recombinations can increasingly occur in the edge region. The material of the encapsulation layer 9 and the separating web 91 facing the semiconductor layer sequence 2 is therefore preferably a material that does not form a good electrical connection to semiconductor layer sequence 2. In an InGaAlP-based semiconductor layer sequence 2, for example, titanium is particularly well suited as material for the encapsulation layer since titanium does not form good contact with an InGaAlP semiconductor material.

The p-type semiconductor region 3 of the light emitting diode chip 1 is rather contacted in the inner region 51. The p-contact vias 14 are passed from the electrically conductive adhesive layer 82 through the dielectric layer 83 to the current spreading layer 7 that connects to the p-type semiconductor region 3.

In FIG. 1, recesses 21, 22 have an edge recess 22 facing the side flanks of the LED chip 1. The separating web 91 is preferably arranged between the edge recess 22 and the side flank of the LED chip 1. In this way, the edge recess 22 at least partially shields the separating web 91 from the radiation emitted in the active layer 4 and thus reduces the absorption of radiation at the separating web 91.

Figure 2:
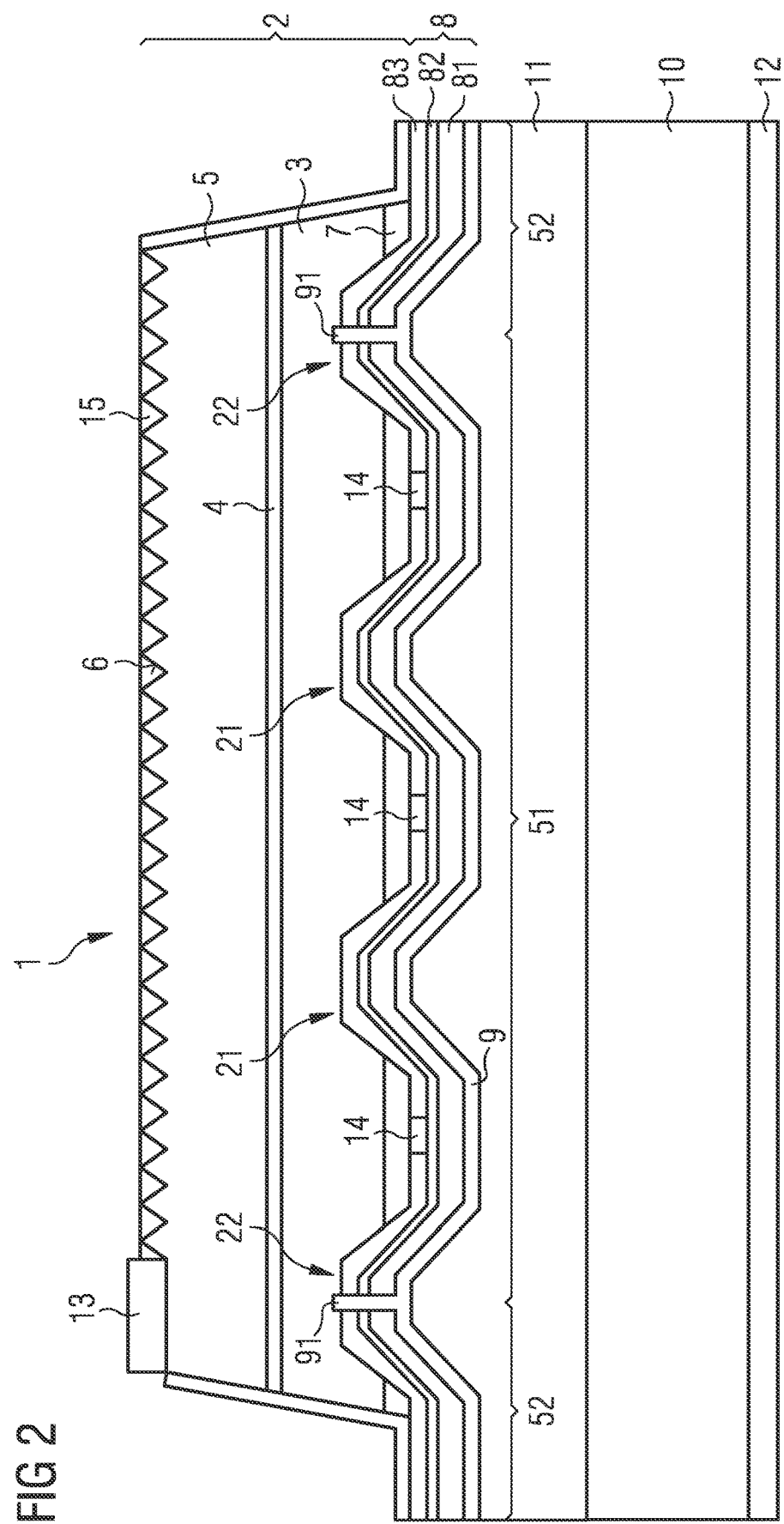
FIG. 2 shows a schematic representation of a cross section through a light emitting diode chip according to a second example.

FIG. 2 shows another example of the LED chip 1 that differs from the example shown in FIG. 1 in that the separating web 91 is arranged in an edge recess 22. This design has the advantage that less space is required next to the edge recess 22 at the edge of the LED chip 1. This allows the edge recess 22 to be arranged even closer to the edge of LED chip 1, enabling more effective use of the area of the LED chip. Furthermore, no separate etching process has to be carried out during production of LED chip 1 to create an opening in the current spreading layer 7 for the separating web 91. This is not necessary because the edge recess 22 already penetrates the current spreading layer 7. Since the edge recess 22 already cuts through the current spreading layer 7 in vertical direction, this is also the case for the separating web 91 arranged within the edge recess.

With regard to further details and advantageous designs, the example shown in FIG. 2 corresponds to the first example.

Figure 3:
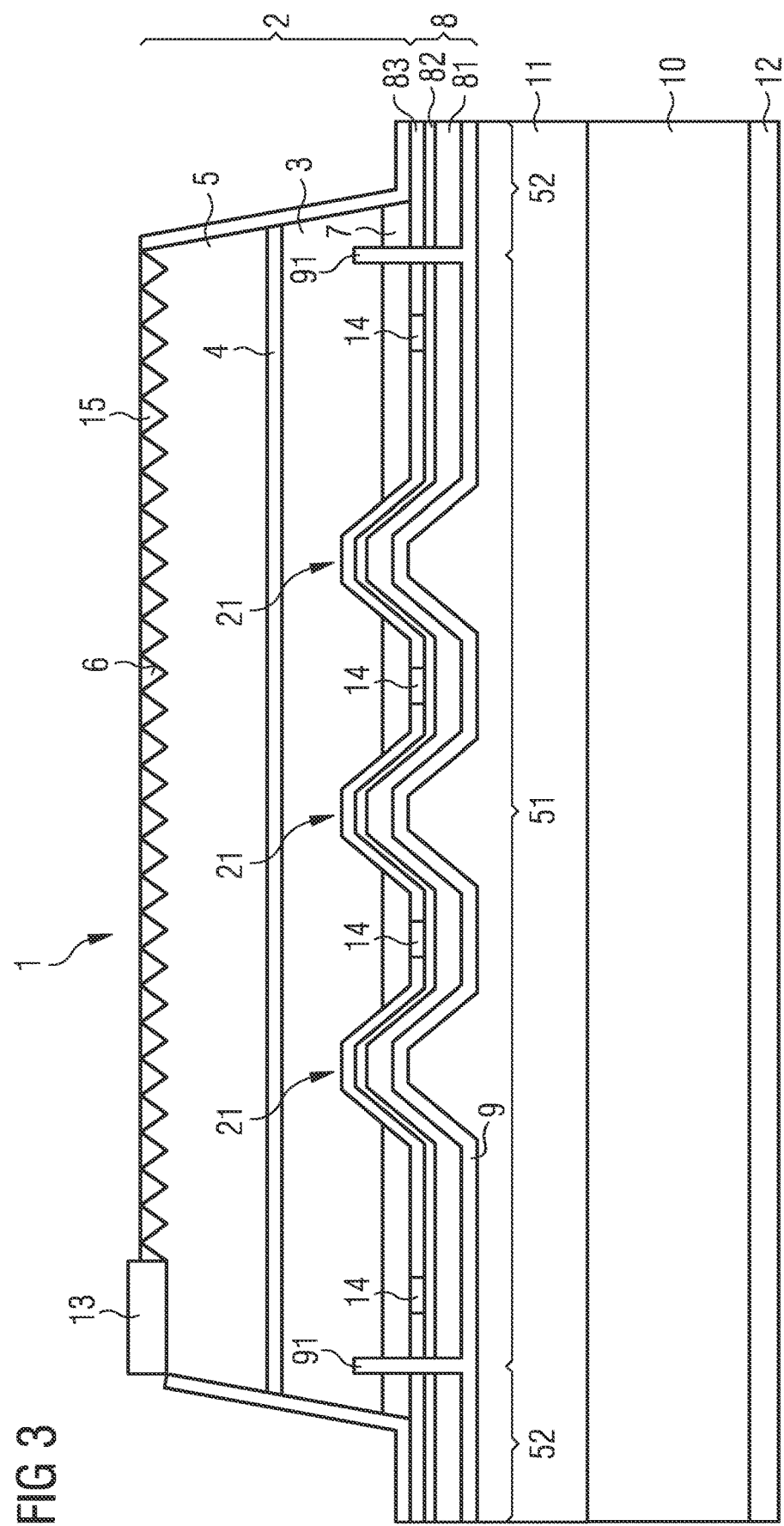
FIG. 3 shows a schematic representation of a cross section through a light emitting diode chip according to a third example.

FIG. 3 shows another example of the light emitting diode chip 1, in which, compared to the previous examples, edge recesses 22 have been dispensed with. The LED chip 1 of FIG. 3 has recesses 21 only in the interior of the LED chip 1. Furthermore, it is also possible to dispense completely with recesses 21 on LED chip 1 (not shown). Omission of the edge recesses 22 increases the space at the edge of the LED chip so that additional p-contact vias 14 can be arranged there, for example. With this design, the separating web 91 can be arranged near the side edge of the LED chip 1, for example, near a p-contact via 14.

With regard to further details and advantageous designs, the example shown in FIG. 3 corresponds to the first example.

Figure 4:
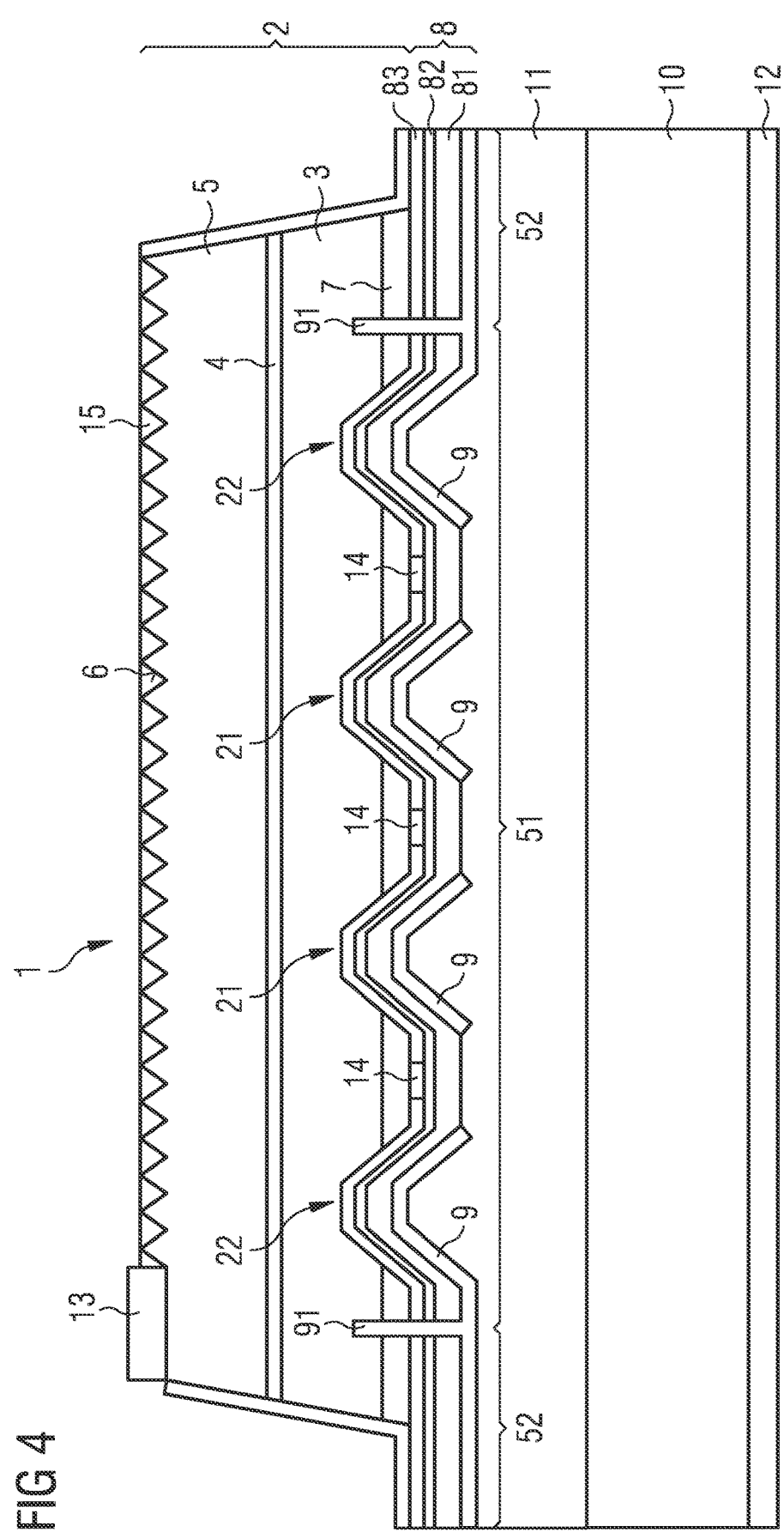
FIG. 4 shows a schematic representation of a cross section through a light emitting diode chip according to a fourth example.

FIG. 4 shows another example of the LED chip 1. Light-emitting diode chip 1 is essentially the same as in FIG. 1, but the encapsulation layer 9 in this example is not a metallic encapsulation layer, but a dielectric encapsulation layer. In particular, the separating web 91, which is part of the encapsulation layer 9, is also formed from a dielectric material in this design. The dielectric layer forming the encapsulation layer 9 is preferably 10 nm to 100 nm thick.

A dielectric layer produced by atomic layer deposition (ALD) is particularly preferred. Aluminum oxide, especially $Al_2O_3$, is particularly suited as material for the dielectric encapsulation layer. Aluminum oxide is advantageously transparent for the emitted radiation so that there is no absorption of the emitted radiation at the separating web 91. However, since dielectric encapsulation layer 9 is not electrically conductive in this configuration, it may be necessary to partially interrupt the dielectric encapsulation layer to establish electrical contact between the metallic mirror layer 83 connected to the p-semiconductor region 3, and the rear electrically conductive layers such as the connecting layer 11, the carrier 10 and the first contact layer 12. This may require an additional lithographic process that increases the manufacturing effort for this example compared to the previous examples.

With regard to further details and advantageous configurations, the example shown in FIG. 4 corresponds to the first example.

Our chips are not limited by the description based on the examples. Rather, this disclosure includes each new feature and each combination of features including in particular each combination of features in the appended claims, even if the feature or combination itself is not explicitly indicated in the claims or examples.

This application claims priority of DE 10 2015 120 323.5, the subject matter of which is incorporated herein by reference.

The invention claimed is:

1. An LED chip comprising:
   a carrier,
   a semiconductor layer sequence,
   a reflective layer sequence arranged in regions between the carrier and the semiconductor layer sequence, wherein the reflective layer sequence comprises a dielectric layer facing the semiconductor layer sequence and a metallic mirror layer facing away from the semiconductor layer sequence, and
   an encapsulating layer arranged in places between the carrier and the reflective layer sequence, the encapsulating layer extending in places through the reflective layer sequence into the semiconductor layer sequence and thus forming a separating web separating an inner region of the reflective layer sequence from an edge region of the reflective layer sequence.

2. The LED chip according to claim 1, wherein the separating web completely encloses the inner region so that the inner region does not adjoin the edge region at any point.

3. The LED chip according to claim 1, further comprising an adhesive layer disposed between the metallic mirror layer and the dielectric layer.

4. The LED chip according to claim 3, wherein the adhesive layer comprises a transparent conductive oxide.

5. The LED chip according to claim 1, wherein the semiconductor layer sequence comprises a current spreading layer disposed on a side of the semiconductor layer sequence facing the reflective layer sequence, the current spreading layer being severed by the separating web.

6. The LED chip according to claim 5, wherein the current spreading layer is based on AlGaAs or GaP.

7. The LED chip according to claim 1, wherein the encapsulating layer is a metallic layer.

8. The LED chip according to claim 1, wherein the encapsulating layer is at least one selected from the group consisting of Ti, Au, Pt, Ni, W and a compound containing at least one of Ti, Au, Pt, Ni, W.

9. The LED chip according to claim 1, wherein the encapsulating layer comprises a Ti layer facing the semiconductor layer sequence.

10. The LED chip according to claim 1, wherein the encapsulating layer is a dielectric layer.

11. The LED chip according to claim 10, wherein the encapsulating layer comprises $Al_2O_3$.

12. The LED chip according to claim 10, wherein the encapsulating layer is formed by atomic layer deposition.

13. The LED chip according to claim 1, wherein the semiconductor layer sequence has recesses on a side facing the carrier, the cross section of the recesses increasing in the direction of the carrier.

14. The LED chip according to claim 13, wherein the recesses have a prism-shaped cross section.

15. The LED chip according to claim 13, wherein the recesses comprise an edge recess facing a side flank of the light emitting diode chip, and the separating web is disposed between the edge recess and a side flank of the light emitting diode chip.

16. The LED chip according to claim 13, wherein the recesses comprise an edge recess facing a side flank of the light emitting diode chip, and the separating web is arranged in the edge recess.

* * * * *